US012557185B2

(12) United States Patent
Chary

(10) Patent No.: US 12,557,185 B2
(45) Date of Patent: Feb. 17, 2026

(54) TRANSPARENT HEATERS FOR IMPROVED EPITAXY REACTOR PRODUCTIVITY

(71) Applicant: Applied Materials, Inc., Santa Clara, CA (US)

(72) Inventor: Sathya Shrinivas Chary, San Francisco, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 732 days.

(21) Appl. No.: 17/875,036

(22) Filed: Jul. 27, 2022

(65) Prior Publication Data

US 2024/0040672 A1 Feb. 1, 2024

(51) Int. Cl.

| | |
|---|---|
| ***H05B 3/84*** | (2006.01) |
| ***C23C 16/48*** | (2006.01) |
| ***H05B 1/02*** | (2006.01) |
| ***H05B 3/00*** | (2006.01) |
| ***H05B 3/03*** | (2006.01) |
| ***H05B 3/06*** | (2006.01) |

(52) U.S. Cl.

CPC ............ *H05B 3/84* (2013.01); *C23C 16/481* (2013.01); *H05B 1/0233* (2013.01); *H05B 3/03* (2013.01); *H05B 3/06* (2013.01); *C23C 16/482* (2013.01); *H05B 3/0047* (2013.01); *H05B 2203/007* (2013.01); *H05B 2214/04* (2013.01)

(58) Field of Classification Search

CPC .......... H05B 3/84; H05B 1/0233; H05B 3/03; H05B 3/06; H05B 3/0047; H05B 2203/007; H05B 2214/04; C23C 16/481; C23C 16/482; C23C 16/46; C30B 25/105; H01L 21/67103; H01L 21/67115

See application file for complete search history.

(56) References Cited

U.S. PATENT DOCUMENTS

| | | | |
|---|---|---|---|
| 8,518,633 | B1 | 8/2013 | Kobrin et al. |
| 2012/0291697 | A1 | 11/2012 | Suzuki et al. |

(Continued)

FOREIGN PATENT DOCUMENTS

| | | | |
|---|---|---|---|
| JP | H02304920 | A | 12/1990 |
| JP | H06283260 | A | 10/1994 |
| JP | H0714665 | A | 1/1995 |
| JP | 2000058455 | A | 2/2000 |
| JP | 2004336648 | A | 11/2004 |
| JP | 2005057406 | A | 3/2005 |

(Continued)

OTHER PUBLICATIONS

International Search Report and Written Opinion dated May 1, 2023 for Application No. PCT/US2023/010124.

(Continued)

*Primary Examiner* — Robert G Bachner

(74) *Attorney, Agent, or Firm* — Patterson + Sheridan, LLP

(57) ABSTRACT

A method and apparatus for heating a transparent component within a semiconductor processing chamber is described. The transparent component is heated using a transparent heater coupled to the transparent component. The transparent heater includes a support base, an electrode layer, and a capping layer. The electrode layer is a heating element. The transparent heater has an optical transparency of greater than about 80% at a wavelength which is emitted by one or more radiation sources within the processing chamber. The transparent heater is a flexible transparent heater or is formed of a plurality of sub-heaters.

17 Claims, 7 Drawing Sheets

(56) References Cited

U.S. PATENT DOCUMENTS

| | | | | |
|---|---|---|---|---|
| 2013/0186239 | A1* | 7/2013 | Whitcomb | B22F 1/00 75/370 |
| 2014/0225154 | A1 | 8/2014 | Daigo | |
| 2019/0127851 | A1 | 5/2019 | Lau et al. | |
| 2020/0045776 | A1* | 2/2020 | Huang | H05B 3/0047 |

FOREIGN PATENT DOCUMENTS

| | | | |
|---|---|---|---|
| JP | 2010103041 | A | 5/2010 |
| JP | 2011204936 | A | 10/2011 |
| KR | 0180910 | B1 | 5/1999 |
| KR | 20130095830 | A | 8/2013 |
| WO | 2022045331 | A1 | 3/2022 |

OTHER PUBLICATIONS

Ke, Shanming et al., "Transparent Indium Tin Oxide Electrodes on Muscovite Mica for High-Temperatue-Processed Flexible Optoelectronic Devices", Applied Materials & Interfaces, 2016.

Xu, Ruixing et al., "High stability of flexible perovskite transparent conductive oxide film via van der Waals heteroepitaxy", Journal of Alloys and Compounds, 2021.

Zhu, Hua et al., "Optical and electrical properties of ITO film on flexible flurphlogopite substrate", Ceramics International 2020.

"Fluorphlogopite—synthetic mica", Continental Trade, https://www.continentaltrade.com.pl/fluorphlogopite-synthetic-mica.

"Corning Gorilla Glass 3".

"Corning Willow Glass".

"Corning HPFS® 7979, 7980, 8655 Fused Silica." Corning, Feb. 2014.

Langley, Daniel et al., "Flexible transparent conductive materials based on silver nanowire networks: a review", Nanotechnology 24, 2013.

Wang, Chenxi et al., "Direct Homo/Heterogeneous Bonding of Silicon and Glass Using Vacuum Ultraviolet Irradiation in Air", Jouranl of The Electrochemical Society, 2018.

Korean Office Action dated Aug. 29, 2025 for Application No. 10-2025-7005989.

Japanese Office Action dated Jan. 6, 2026 for Application No. 2025-504273.

* cited by examiner

TRANSPARENT HEATERS FOR IMPROVED EPITAXY REACTOR PRODUCTIVITY

BACKGROUND

Field

Embodiments of the present disclosure generally relate apparatus and methods for fabricating semiconductor devices. More specifically, apparatus disclosed herein relate to heating of transparent surfaces on an outer surface of a reactor body of an epitaxial deposition process chamber using one or more resistive heating elements. Methods of using the same are also disclosed.

Description of the Related Art

Semiconductor substrates are processed for a wide variety of applications, including the fabrication of integrated devices and micro-devices. One method of substrate processing includes depositing a material, such as a dielectric material or a conductive metal, on an upper surface of the substrate in a processing chamber. For example, epitaxy is a deposition process that grows a thin, ultra-pure layer, usually of silicon or germanium on a surface of a substrate. The material may be deposited in a lateral flow chamber by flowing a process gas parallel to the surface of a substrate positioned on a support and thermally decomposing the process gas to deposit a material from the process gas onto the substrate surface.

During epitaxial deposition, the process volume is separated into an upper region and a lower region. In the upper region, a process gas is flowed over a substrate and a top surface of a susceptor. The lower region is purged to reduce the amount of process gas which is flowed into the lower region. However, the upper region and the lower region are not isolated from one another. When process gas inadvertently is flowed into the lower region, a film may form on a lower transmissive member within the process volume. The temperature of the lower transmissive member determines the amount of particle/film deposition on the lower transmissive member as well as the etch rate of the film during process chamber cleaning. As the lower transmissive member is not uniform in temperature, the film coating on the lower transmissive member becomes uneven over time and causes reduced predictability of deposition on the substrate.

Therefore, there is a need for improved temperature control of the transmissive members within a processing chamber.

SUMMARY

In one embodiment, a heater assembly, configured for use during semiconductor manufacturing, comprises a chamber component; a transparent heater coupled to the chamber component and comprising: a support base; and an electrode disposed on the support base.

In another embodiment, a heater assembly, configured for use during semiconductor manufacturing, comprises: a transmissive window; a transparent heater coupled to the transmissive window and comprising: a support base; and an electrode disposed on the support base.

In another embodiment, a process chamber, configured for use during semiconductor processing, comprises a chamber body; an upper transmissive window disposed within the chamber body; a lower transmissive window disposed within the chamber body; a substrate support disposed between the upper transmissive window and the lower transmissive window; and a transparent heater coupled to one of the upper transmissive window or the lower transmissive window.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure is directed towards heating of transparent surfaces on an outer surface of a reactor body of an epitaxial deposition process chamber using one or more resistive heating elements. More specifically, an upper and a lower transmissive member of an epitaxial deposition process chamber may have one or more transparent heaters positioned thereon to reduce the impact of cold spots on the formation and removal of films on the transmissive members. The transparent heaters are configured to enable radiation from lamps or other radiation devices within the process chamber to pass therethrough and are also flexible to enable the transparent heaters to be positioned on a curved or irregular surface, such as near a neck of a transmissive member.

In deposition processes, such as epitaxial deposition processes, high process temperatures are generally utilized. Therefore, the heaters discussed herein are configured to withstand high processing temperatures, adhere to irregular and curved surfaces, maintain optical transparency in desired wavelength ranges, and enable location-specific heating of a transmissive member quickly and accurately. The use of a heater as described herein on a chamber component, such as an optically transparent member, reduces the temperature gradient across the optically transparent member and therefore enables the more control over film deposition and etching on the optically transparent member.

It has been found that lower temperatures in some portions of a transmissive member within the process chamber lead to increased condensation of deposition precursors, such as epitaxial deposition precursors, on portions of the transmissive member while reducing the efficiency of etching at those same portions of the transmissive member. Location specific heating of the transmissive member therefore simultaneously reduces undesired film deposition while improving the efficiency of etching which would remove the deposited film.

Figure 1A:
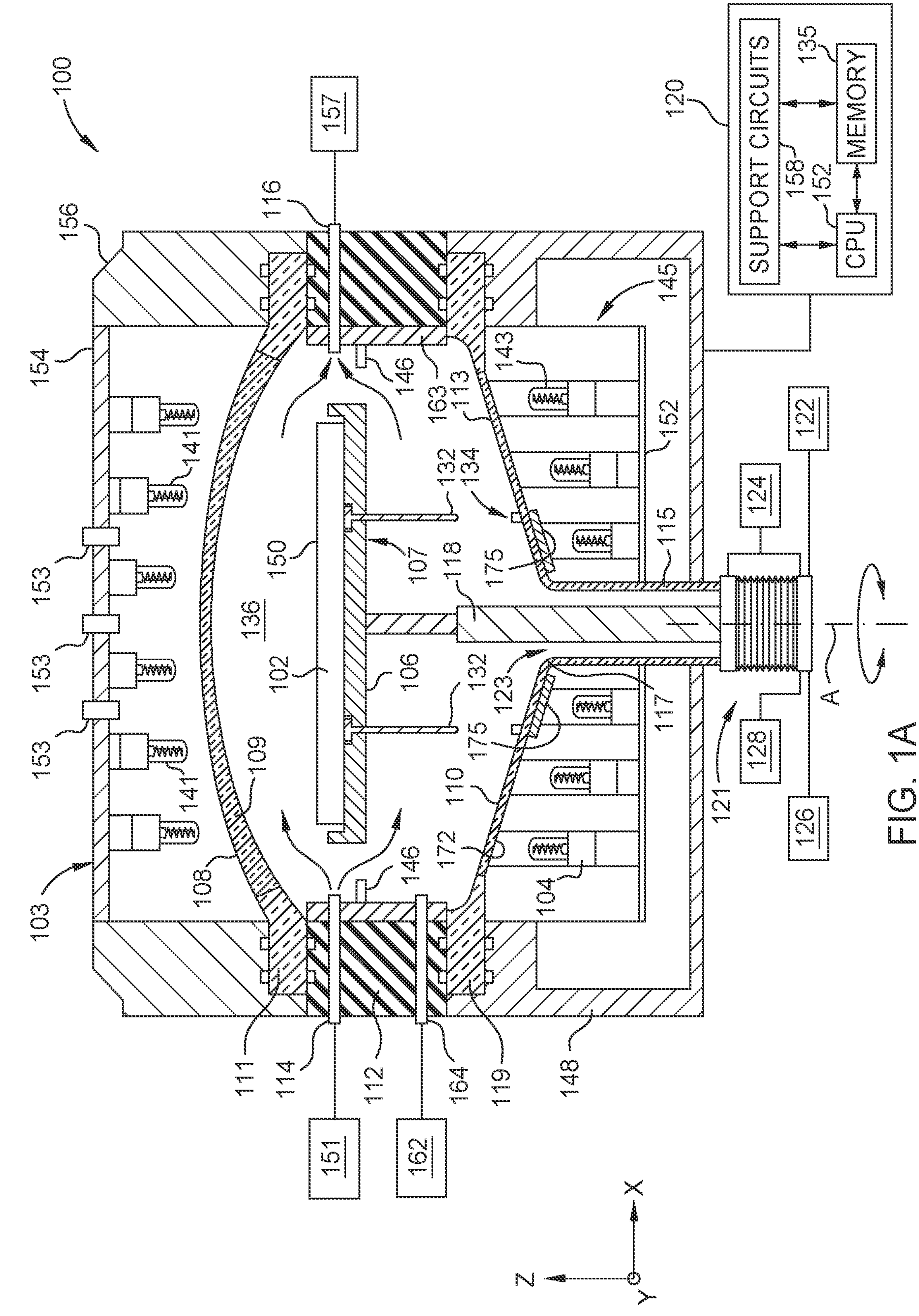
FIGS. 1A-1B are schematic illustrations of deposition chambers, according to embodiments of the disclosure.
Figure 1B:
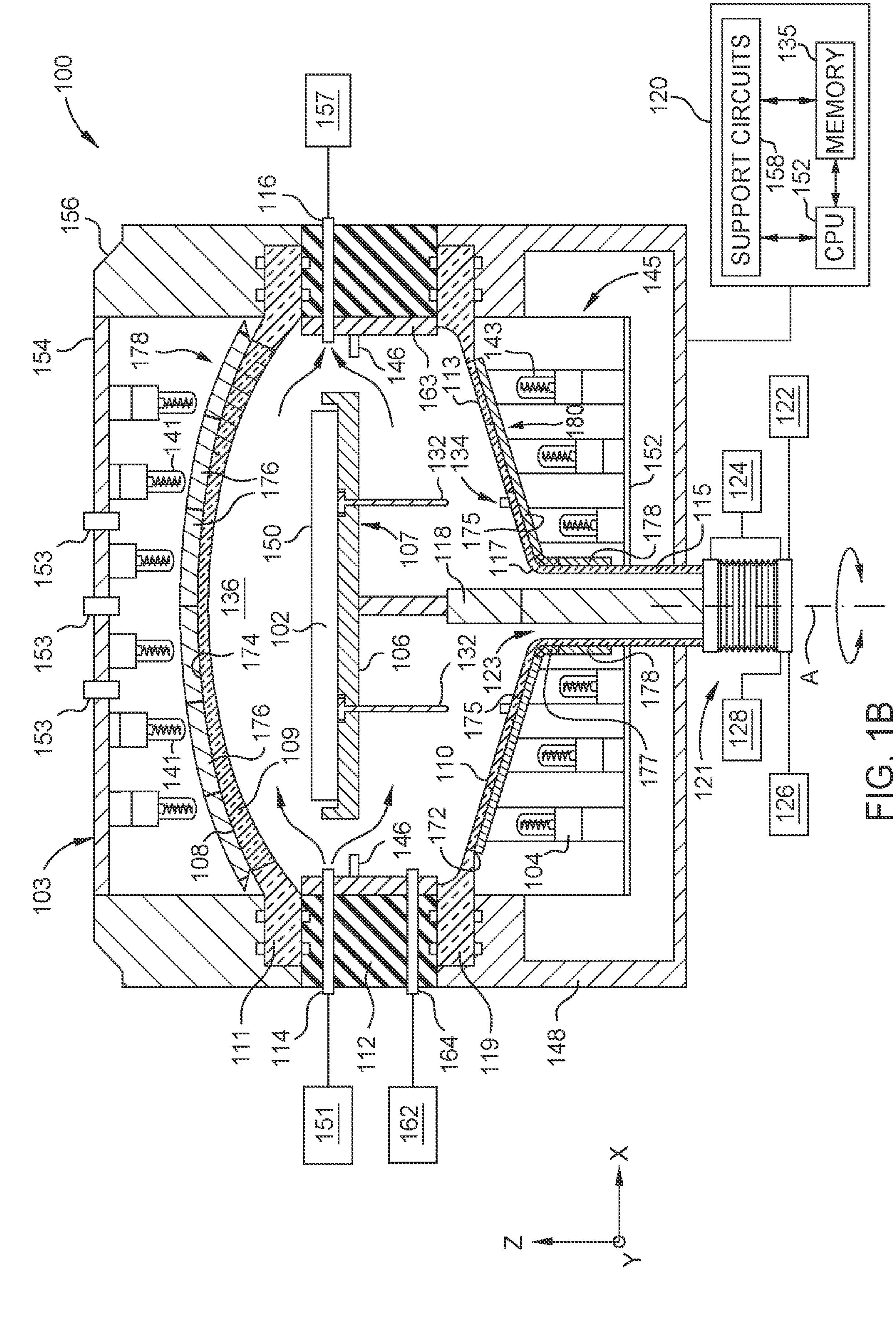

FIGS. 1A-1B are schematic illustrations of deposition chambers 100 with various transparent heaters disposed therein. FIG. 1A is a schematic illustration of a first embodiment of the deposition chamber 100. FIG. 1B is a schematic illustration of a second embodiment of the deposition chamber 100. The deposition chamber 100 is utilized to grow an epitaxial film on a substrate, such as the substrate 102. The deposition chamber 100 creates a cross-flow of precursors across the top surface 150 of the substrate 102.

The deposition chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper transmissive window 108, a lower transmissive window 110, a plurality of upper lamps 141, and a plurality of lower lamps 143. As shown, the controller 120 is in communication with the deposition chamber 100 and is used to control processes, such as those described herein. The substrate support 106 is disposed between the upper transmissive window 108 and the lower transmissive window 110. The plurality of upper lamps 141 are disposed between the upper transmissive window 108 and a lid 154. The lid 154 includes a plurality of sensors 153 disposed therein for measuring the temperature within the deposition chamber 100. The plurality of lower lamps 143 are disposed between the lower transmissive window 110 and a floor 152. The plurality of lower lamps 143 form a lower lamp assembly 145.

A process volume 136 is formed between the upper transmissive window 108 and the lower transmissive window 110. The upper transmissive window 108 may have a dome shape and may be referred to as an upper dome. The upper transmissive window 108 has an upper dome portion 109, sometimes referred to as a central window portion in embodiments where the upper dome portion 109 is not dome-shaped, and a support ring 111. The support ring 111 is coupled to an outer edge of the upper dome portion 109 and is disposed between the upper body 156 and the flow module 112. The lower transmissive window 110 may also be a dome shape, such that the lower transmissive window 100 has a lower dome portion 113, sometimes referred to as a central window portion in embodiments where the lower dome portion 113 is not dome-shaped, with a central opening 123 in the center of the lower dome portion 113 for the shaft 118 of the substrate support 106 to be disposed therethrough. A hollow transmissive member shaft 115 extends from the central opening 123 within the lower dome portion 113 of the lower transmissive window 110 and along the length of the shaft 118. The hollow transmissive member shaft 115 connects to the lower dome portion 113 at a neck 117 of the lower transmissive window 110. The lower dome portion 113 of the lower transmissive window 100 is connected to a support ring 119 at an outer edge of the lower dome portion 113. The support ring 119 is disposed between the lower body 148 and the flow module 112.

The process volume 136 has the substrate support 106 disposed therein. The substrate support 106 includes a top surface on which the substrate 102 is disposed. The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the process volume 136. The motion assembly 121 includes a rotary actuator 122 that rotates the shaft 118 and/or the substrate support 106 about a longitudinal axis A of the deposition chamber 100. The motion assembly 121 further includes a vertical actuator 124 to lift and lower the substrate support 106 in the z-direction. The motion assembly includes a tilt adjustment device 126 that is used to adjust the planar orientation of the substrate support 106 and a lateral adjustment device 128 that is used to adjust the position of the shaft 118 and the substrate support 106 side to side within the process volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a processing position to a transfer position.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides 146 are disposed below the plurality of process gas inlets 114 and the one or more exhaust gas outlets 116. The flow guide 146 is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface 150 of a substrate 102 disposed within the process volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157. Each of the process gas source 151 and the purge gas source 162 may be configured to supply one or more precursors or process gases into the process volume 136.

One or more heaters are coupled to an outside surface of one or both of the upper transmissive window 108 or the lower transmissive window 110. The one or more heaters are optically transparent to radiation at wavelengths emitted by the plurality of upper lamps 141 and the plurality of lower lamps 143. Various configurations of heaters may be utilized. FIG. 1A illustrates a first embodiment of how one or more transparent heaters 175 may be utilized within the deposition chamber 100. The one or more transparent heaters 175 are attached to the lower transmissive window 110 at an outside surface 172. The outside surface 172 is opposite to the surface exposed to the process volume 136. The one or more transparent heaters 175 are flexible and coupled to the outside surface 172 between the lower dome portion 113 and the neck 117 of the lower transmissive window 110. The one or more transparent heaters 175 are positioned over a portion of the lower transmissive window 110 which would usually have a cold spot.

In some embodiments, there is a single transparent heater 175 wrapped around the neck 117 of the lower transmissive window 110, such that the transparent heater 175 forms a ring or a partial ring. The ring formed by the transparent heater 175 may be split on one side to enable the transparent heater 175 to be fitted around the hollow transmissive member shaft 115. Alternatively, the transparent heater 175 does not have a split and is fitted over the hollow transmissive shaft member 115 and slid into place around the neck 117 of the lower transmissive window 110.

In other embodiments, the one or more transparent heaters 175 are a plurality of transparent heaters 175 tiled together to form a ring, such as two or more transparent heaters 175 forming a ring or three or more transparent heaters 175 forming a ring.

FIG. 1B illustrates a second embodiment of how transparent heaters 175, 176, 177, 178 may be utilized within the deposition chamber 100. In addition to the one or more transparent heaters 175 attached the lower transmissive window 110, the deposition chamber 100 of FIG. 1B further includes one or more transmissive member shaft heaters 178, one or more neck heaters 177, and one or more upper transmissive member heaters 176 disposed on an outside surface 174 of the upper transmissive window 108. Each one of the transparent heaters 175, the neck heaters 177, the transmissive member shaft heaters 178, and the upper transmissive member heaters 176 are similar in composition, but may be independently controlled to provide temperature control of different zones of the upper and lower transmissive windows 108, 110. Each of the transparent heaters 175, the neck heaters 177, the transmissive member shaft heaters 178, and the upper transmissive member heaters 176 may also be further broken into smaller zones of different heaters which may be controlled independently to provide fine-tuning of the upper and lower transmissive windows 108, 110.

The one or more transmissive member shaft heaters 178 are disposed on the outside surface 172 at the hollow transmissive member shaft 115, such that the one or more transmissive member shaft heaters 178 extend from the neck 117 down towards the motion assembly 121. The one or more neck heaters 177 are disposed on the outside surface 172 at the neck 117 of the lower transmissive window 110. The upper transmissive member heaters 176 are disposed on the outside surface 174 of the upper dome portion 109. In some embodiments, the upper transmissive member heaters 176 cover a majority of the outside surface 174 over the upper dome portion 109, such as over 75% of the outside surface 174 of the upper dome portion 109, such as over 90% of the outside surface 174 of the upper dome portion 109.

The one or more transparent heaters 175 may also be configured to cover a larger portion of the lower transmissive window 110 in the embodiment of FIG. 1B than in the embodiment of FIG. 1A. In the deposition chamber 100 of FIG. 1B, the one or more transparent heaters 175 cover almost an entirety of the outside surface 172 of the lower dome portion 113 of the lower transmissive window 110, such as over 90% of the surface area of the outside surface 172 of the lower dome portion 113.

Figure 2:
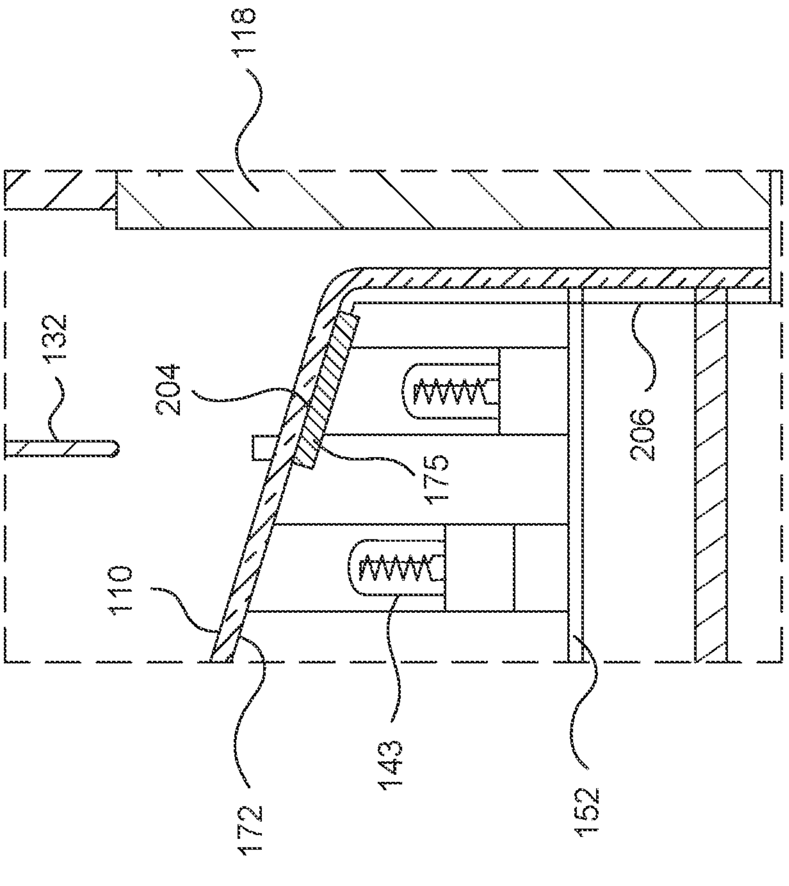
FIG. 2 is a schematic close-up view of a portion of the deposition chamber of FIG. 1A.

FIG. 2 is a schematic close-up view of a portion of the deposition chamber 100 of FIG. 1A. As shown in the close-up of FIG. 2, the one or more transparent heaters 175 are directly coupled to the outside surface 172 of the lower transmissive window 110 at a contact surface 204 of the transparent heater 175. The contact surface 204 is flush with the outside surface 172 of the lower transmissive window 110 and may have an adhesive disposed thereon.

The adhesive is configured to adhere the transparent heater 175 to the lower transmissive window 110. The adhesive may be heat activated. The adhesive itself is also optically transparent to prevent radiation from passing into and out of the transparent heater 175. Alternatively, it is contemplated that optical adhesives may be omitted, depending on process temperature requirements. In such an example, a support base 304 (See FIG. 3) and/or encapsulation layer 308 for the transparent heater 175 may be formed of mica. In such an example, the transparent heater 175 may be held in place using small glass tabs directly bonded to the lower transmissive window 110 (or upper transmissive window, as desired) by ozone plasma treatment. The tabs may support the transmissive window 110, or may facilitate adhesion between the transmission window 110 and the transparent heater 175. The support base 304 and the encapsulation layer 308 may contact each of other at edges thereof (thus encapsulating the electrode 306), and the support base 304 and encapsulation layer may be adhered to one another directly or via adhesion to the electrode 306. In yet another example, if the support base 304 and/or the encapsulation layer 308, ozone plasma treatment can be used to directly bond one or both of the support base 304 and/or the encapsulation layer 308 to a transparent window.

In some embodiments, the outside surface 172 of the lower transmissive window 110 and the contact surface 204 of the transparent heater 175 are bonded using a vacuum ultraviolet (VUV) irradiation process in which one of the transparent heater 175 or the transmissive window 110 are exposed to oxygen radicals and ozone to react with one of the contact surface 204 or the outside surface 172. Bonding the lower transmissive window 110 and the transparent heater 175 reduces the number of boundaries through which radiation passes compared to the use of an adhesive and also reduces the potential energy lost through the extra adhesive layer.

A lead line 206 is connected to at least one part of the transparent heater 175. The lead line 206 is a wire or cable which connects the transparent heater 175 to the controller 120. The lead line 206 may be run along an outside of the lower transmissive window 110.

Each of the transparent heaters 176, 177, 178 are further coupled to their respective upper transmissive window 108 or the lower transmissive window 110 using adhesive or bonding techniques similar to those used to bond the transparent heater 175 to the lower transmissive window 175. Each of the transparent heaters 176, 177, 178 may further be coupled to the controller 120 via one or more lead line 206.

Figure 3:
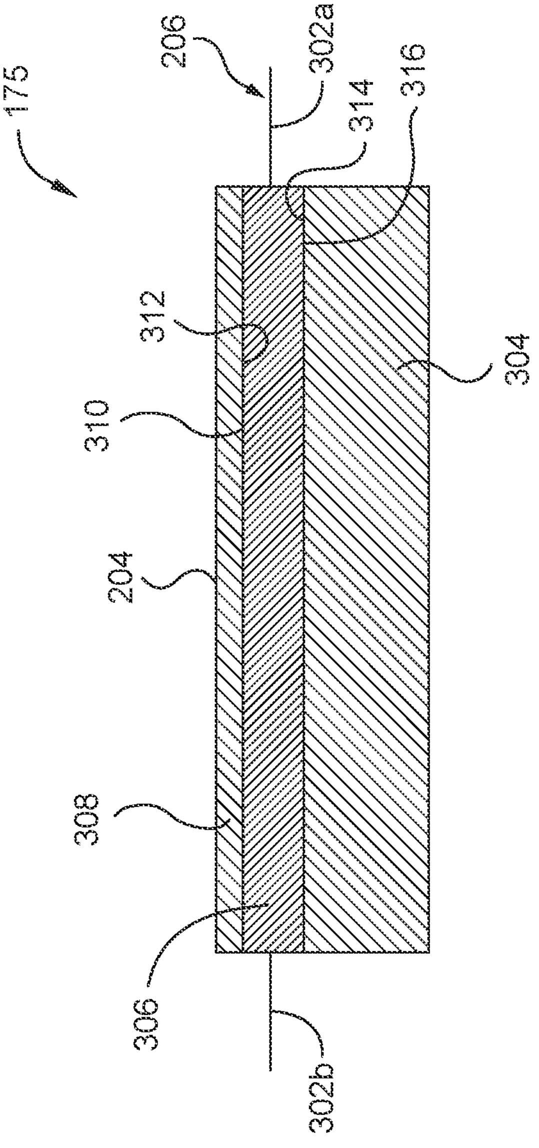
FIG. 3 is a schematic cross-sectional view of a transparent heater, according to embodiments of the disclosure.

FIG. 3 is a schematic cross-sectional view of a transparent heater 175. Each of the transparent heaters 176, 177, 178 are similar in composition to the transparent heater 175. The transparent heater 175 includes a support base 304, an electrode 306, and an encapsulation layer 308 The electrode 306 may further be referred to as a heating element and may function as a resistive heating element.

The support base 304 is a transparent support base and is disposed on an opposite side of the electrode 306 from the lower transmissive window 110. The support base 304 is an optically transparent material and does not degrade at high process temperatures, such as temperatures greater than about 400° C., such as temperatures greater than about 500° C., such as temperatures greater than about 600° C., such as temperatures greater than about 700° C. The support base 304 is the thickest layer of the transparent heater 175 out of the support base 304, the electrode 306, and the encapsulation layer 308.

The support base 304 has an optical transparency of greater than about 80% at a desired radiation wavelength, such as an optical transparency of greater than about 85%, such as an optical transparency of greater than about 90%, such as an optical transparency of greater than about 95%, such as an optical transparency of greater than about 97%, such as an optical transparency of greater than about 99%. The desired radiation wavelength is a wavelength which is emitted by one or more radiation sources within the deposition chamber 100. In some embodiments, the desired radiation wavelength is an infrared (IR) wavelength. In some embodiments, the desired radiation wavelength is less than about 5000 nm, such as about 300 nm to about 5000 nm, such as about 500 nm to about 3000 nm, such as about 500 nm to about 2500 nm, such as about 500 nm to about 2000 nm, such as about 500 nm to about 1500 nm, such as about 500 nm to about 1000 nm.

The support base 304 is formed of a flexible material to enable the support base 304 to curve along with a curvature of one of the upper transmissive window 108 or the lower transmissive window 110. The flexibility of the support base 304 is such that a transparent heater 177 may be placed on the neck of the lower transmissive window 110. The support base 304 may have a Young's modulus of less than about 150 GPa, such as about 0.1 GPa to about 150 GPa, such as about 0.1 GPa to about 100 GPa, such as about 0.5 GPa to about 75 GPa, such as about 1 GPa to about 50 GPa.

The support base 304 may be formed from one or a combination of materials. In some embodiments, the support base 304 is a mica material, such as a muscovite mica material or a fluorphlagopite mica. The mica material is both flexible and able to be heated to a high process temperature without breakdown of the support base 304. In some embodiments, commercial materials may be used to form the support base 304, such as Gorilla® glass or Willow® glass manufactured by Corning®.

In some embodiments, non-flexible materials are utilized for the support base 304 and multiple transparent heaters 175 are assembled together to form a transparent heater assembly. Each of the transparent heaters 175 within the transparent heater assembly may be coupled together both mechanically and electrically. In some embodiments, an infrared (IR) grade fused silica is utilized. Tiling multiple transparent heaters 175 together enables for a larger range of materials to be utilized for the support base 304 and improved conformity to the outside surface 172 of the lower transmissive window 110.

The electrode 306 is formed between the support base 304 and the encapsulation layer 308. The electrode 306 has a sheet resistance of 1 Ohm/Square to 1000 Ohm/Square, such as 1 Ohm/Square to 1000 Ohm/Square, or such as 100 Ohm/Square to 8000 Ohm/Square. The resistivity of the electrode 306 enables heat to be generated by the transparent heater 175. The electrode 306 may be configured to output a power of about 100 $W/m^2$ to 5000 $W/m^2$, such as about 1000 W/m2 to ~2500 W/m2, or such as about 2500 W/m2 to ~5000 W/m2.

The electrode 306 is formed of an optically transparent material, such that the electrode has an optical transparency of greater than about 80% at a desired radiation wavelength, such as an optical transparency of greater than about 85%, such as an optical transparency of greater than about 90%, such as an optical transparency of greater than about 95%, such as an optical transparency of greater than about 97%, such as an optical transparency of greater than about 99%. The desired radiation wavelength is a wavelength which is emitted by one or more radiation sources within the deposition chamber 100. In some embodiments, the desired radiation wavelength is an infrared (IR) wavelength. In some embodiments, the desired radiation wavelength is less than about 5000 nm, such as about 300 nm to about 5000 nm, such as about 500 nm to about 3000 nm, such as about 500 nm to about 2500 nm, such as about 500 nm to about 2000 nm, such as about 500 nm to about 1500 nm, such as about 500 nm to about 1000 nm.

The electrode 306 is flexible and able to be stretched in a similar manner as the support base 304. The electrode 306 has a Young's modulus of less than about 150 GPa, such as about 0.1 GPa to about 150 GPa, such as about 0.1 GPa to about 100 GPa, such as about 0.5 GPa to about 75 GPa, such as about 1 GPa to about 50 GPa.

In some embodiments, the electrode 306 is formed of a transparent conducting oxide, such as a metal oxide or transition metal oxides. Exemplary conducting oxides include an indium tin oxide, an indium gallium zinc oxide, or a perovskite $CaVO_3$. In some embodiments, the electrode 306 is formed from a nanowire network, such as a metal nanowire network. The nanowire network may be one or a combination of a silver nanowire network, an aluminum nanowire network, a gold nanowire network, or a copper nanowire network. A nanowire network is an overlaid network of wires with a diameter of less than about 250 nm, such as less than about 50 nm, such as less than about 25 nm. In one example, the diameter of the wires is about 25 nm to about 250 nm.

Nanowire networks are beneficial for use as an electrode 306 within a transparent heater, such as the transparent heater 175 due to the optical transparency of a nanowire network as well as the flexibility of the nanowire network. Nanowire networks have been found to be flexible and easily printed onto a base substrate, such as the support base 304. Nanowire networks may also be very durable when exposed to high temperatures, such as those utilized during epitaxial deposition processes.

The electrode 306 is coupled to one or more lead lines 206, such that the electrode 306 has a positive terminal 302*a* and a negative terminal 302*b*. The positive terminal 302*a* and the negative terminal 302*b* are utilized to flow a current through the electrode 306 to heat the electrode 306. The positive terminal 302*a* may be held at a higher voltage than the negative terminal 302*b*. The positive terminal 302*a* and the negative terminal 302*b* are a metal wire. One or more contacts may also be disposed on either side of the electrode 306.

The encapsulation layer 308 is disposed over the electrode 306 and is configured to separate the electrode 306 from the lower transmissive window 110. The encapsulation layer 308 may be an adhesive or may be used as an adhesive to bond the transparent heater 175 to the lower transmissive window 110. In some embodiments, the encapsulation layer 308 is a resin. The encapsulation layer 308 may be the same or a similar material to the support base 304. Therefore, the support base 304 is a mica material, such as a muscovite mica material or a fluorphlagopite mica. The mica material is both flexible and able to be heated to a high process temperature without breakdown of the encapsulation layer 308. In some embodiments, commercial materials may be used to form the encapsulation layer 308, such as Gorilla® glass or Willow® glass manufactured by Corning®. In another example, the both the encapsulation layer 308 and the support base 304 are formed of glass, and the encapsulation layer 308 and the support base 304 are bonded to one another via ozone plasma processing. In some embodiments, it is contemplated that the encapsulation layer 308 may be omitted, if the electrode 306 is process-compatible with the environment.

The encapsulation layer 308 is formed of an optically transparent material, such that the encapsulation layer 308 has an optical transparency of greater than about 80% at a desired radiation wavelength, such as an optical transparency of greater than about 85%, such as an optical transparency of greater than about 90%, such as an optical transparency of greater than about 95%, such as an optical transparency of greater than about 97%, such as an optical transparency of greater than about 99%. The desired radiation wavelength is a wavelength which is emitted by one or more radiation sources within the deposition chamber 100. In some embodiments, the desired radiation wavelength is an infrared (IR) wavelength. In some embodiments, the desired radiation wavelength is less than about 5000 nm, such as about 300 nm to about 5000 nm, such as about 500 nm to about 3000 nm, such as about 500 nm to about 2500 nm, such as about 500 nm to about 2000 nm, such as about 500 nm to about 1500 nm, such as about 500 nm to about 1000 nm.

The encapsulation layer 308 is flexible and able to be stretched in a similar manner as the support base 304. The electrode 306 has a Young's modulus of less than about 150 GPa, such as about 0.1 GPa to about 150 GPa, such as about 0.1 GPa to about 100 GPa, such as about 0.5 GPa to about 75 GPa, such as about 1 GPa to about 50 GPa.

The encapsulation layer 308 electrically isolates the electrode 306 and the lower transmissive window 110. The encapsulation layer 308 is thermally conductive to enable heat generated by the electrode 306 to be quickly dissipated throughout the encapsulation layer 308 and to the lower transmissive window 110. Having a high electrical resistivity reduces the potential for arcing or current leakage from the electrode 306. The electrical resistivity of the encapsulation layer is about $10^{10}$ Ω·m or greater, such as about $10^{12}$ Ω·m or greater, such as about $10^{14}$ Ω·m or greater, such as about $10^{15}$ Ω·m or greater. The thermal conductivity is about 0.5 W/m K or greater, such as about 3 W/m K or greater, such as about W/m K or greater, such as about 100 W/m K or greater. Having a higher thermal conductivity enables for more rapid temperature adjustment of a portion of the lower transmissive window 110.

The electrode 306 includes a first surface 310 and a second surface 316 opposite the first surface 310. The encapsulation layer 308 is disposed on the first surface 310, such that an electrode contact surface 312 of the encapsulation layer 308 contacts the first surface 310. The electrode 306 is disposed on the support base 304, such that the second surface 316 of the electrode 306 contacts a support surface 314 of the support base 304.

In embodiments described herein, the assembled transparent heater 175 has an optical transparency of greater than about 80% at a desired radiation wavelength, such as an optical transparency of greater than about 85%, such as an optical transparency of greater than about 90%, such as an optical transparency of greater than about 95%, such as an optical transparency of greater than about 97%, such as an optical transparency of greater than about 99%. The desired radiation wavelength is less than about 5000 nm, such as about 300 nm to about 5000 nm, such as about 500 nm to about 3000 nm, such as about 500 nm to about 2500 nm, such as about 500 nm to about 2000 nm, such as about 500 nm to about 1500 nm, such as about 500 nm to about 1000 nm.

Figure 4A:
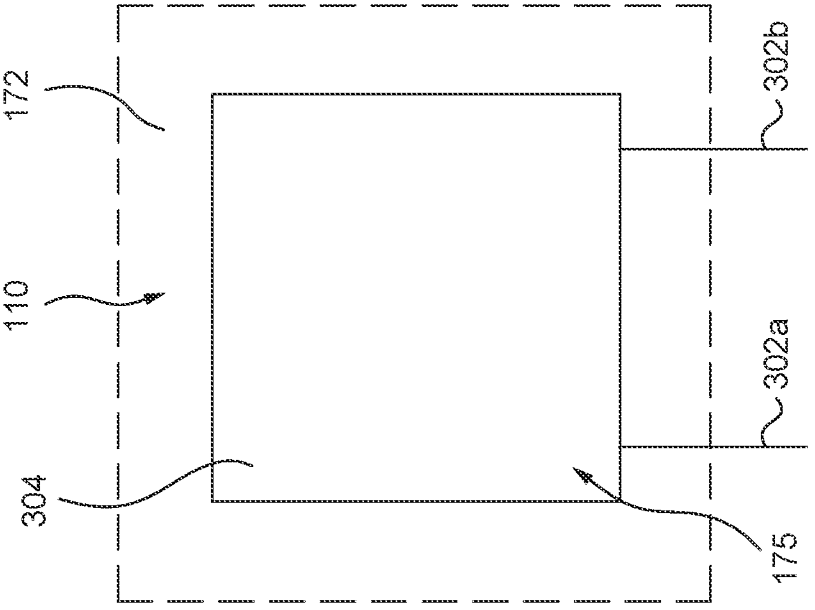
FIGS. 4A-4D are schematic plan views of various heater configurations, according to embodiments of the disclosure.

FIGS. 4A-4D are schematic plan views of various heater configurations of the transparent heaters 175, 176, 177, 178. As shown in FIG. 4A, a single rectangular transparent heater 175 is disposed on the outside surface 172 of the lower transmissive window 110. Both of the positive terminal **302*a* and the negative terminal 302*b* extend in the same direction from the transparent heater 175. The embodiment of FIG. 4A may be utilized when the support base 304 and the other components of the transparent heater 175 are flexible or when the transparent heater 175 is disposed on a flat portion of a device, such as one of the upper transmissive window 108 or the lower transmissive window 110. The configuration of the transparent heater 175 which is illustrated in FIG. 4A is may be similar to a transparent heater 176 which is utilized on the upper transmissive window 108**.

Figure 4B:
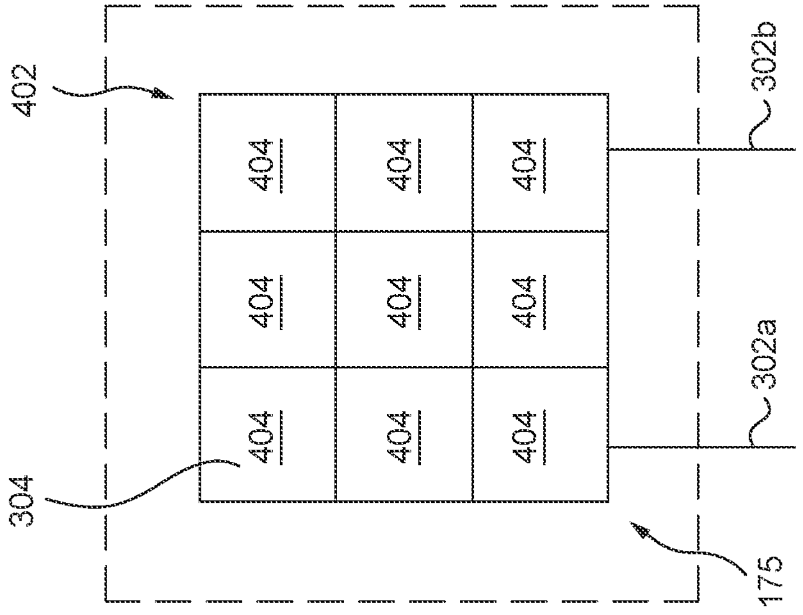

In the embodiment of FIG. 4B, the transparent heater 175 is formed of a grouping 402 of a plurality of sub-heaters 404. The plurality of sub-heaters 404 may be rectangular in shape and may form a portion of the transparent heater 175. The plurality of sub-heaters 404 are similar in composition to a single transparent heater 175 as described with respect to FIG. 3. However, each of the transparent heaters 175 are able to be actuated slightly with respect to one another, such that the plurality of sub-heaters 404 enable a greater range of flexibility of the application of the transparent heater 175. The use of a plurality of sub-heaters 404 further enables additional materials to be utilized within the support base 304, the electrode 306, and the encapsulation layer 308 as the materials may be more rigid and less flexible. However, because one or more of the sub-heaters 404 may be oriented in different directions with respect to the other sub-heaters 404, the transparent heater 175 may be disposed over a curved surface, such as a curved portion of the upper transmissive window 108 or the lower transmissive window 110. Each of the sub-heaters 404 are electrically connected, such that a power line is disposed through each of the sub-heaters 404 and connects each of the sub-heaters 404 to the positive terminal **302*a* and the negative terminal 302*b*. The sub-heaters 404 may be connected either in parallel or in series. In some embodiments, the sub-heaters 404 may be further grouped, such that some sub-heaters 404 form a first heating zone while other sub-heaters 404 form a second heating zone which corresponds to a different portion of one of the upper transmissive window 108 or the lower transmissive window 110** than the first heating zone.

Figure 4D:
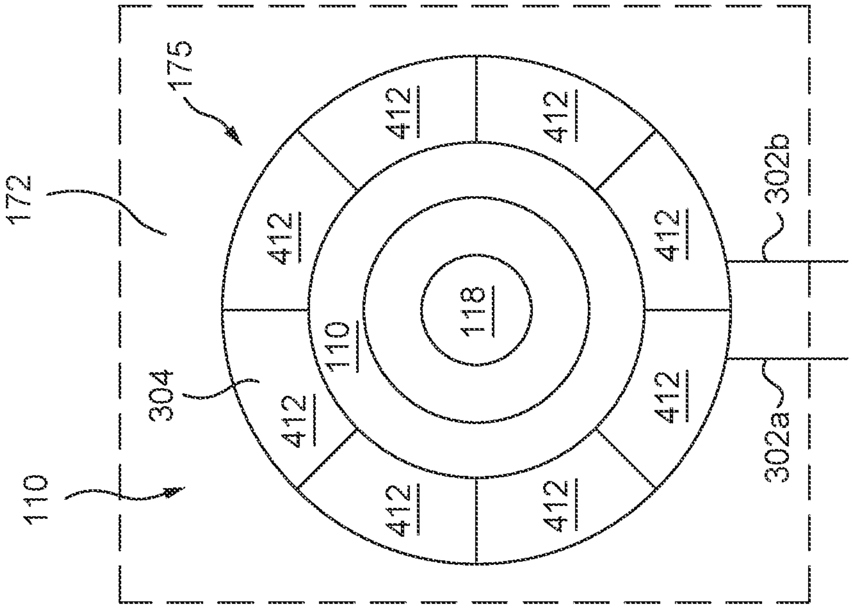
Figure 4C:
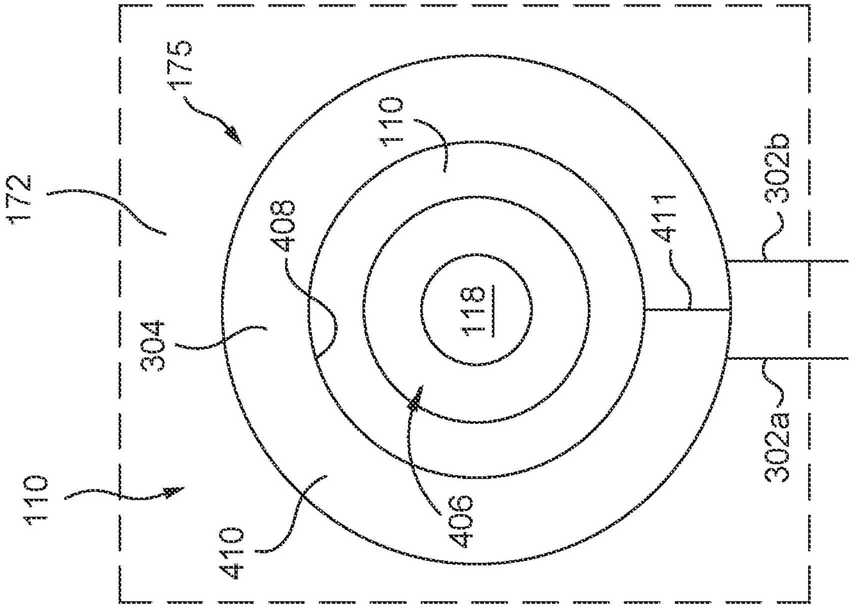

In the embodiment of FIG. 4C, the transparent heater 175 is an annular heater 410 or a plurality of annular heaters. The annular heater 410 is disposed on the lower transmissive window 110. The annular heater 410 is disposed around a shaft opening 406 of the lower transmissive window 110. The shaft 118 of the substrate support 106 is disposed inward of the shaft opening 406. The annular heater 410 may be open at one end, such that the annular heater 410 has a junction 411 at which two ends of the annular heater 410 are able to be coupled and decoupled when being installed onto the lower transmissive window 110 or maintained. In some embodiments, the annular heater 410 is slid over the hollow transmissive member shaft 115 such that a junction 411 is not utilized. In embodiments in which the annular heater 410 is separated at the junction 411, the annular heater 410 is flexible to enable the annular heater 410 to be opened at the junction 411 and placed around the hollow transmissive member shaft 115.

The positive terminal **302*a* is disposed at a first end of the annular heater 410 while the negative terminal 302*b* is disposed at a second end of the annular heater 410. The transparent heater 175 has an electrode, such as the electrode 306 disposed therethrough and connecting the positive terminal 302*a* and the negative terminal 302*b***.

In some embodiments, the annular heater 410 is split into a plurality of annular heaters, which include an inner annular heater and an outer annular heater. The inner annular heater being disposed radially inside of the outer annular heater, such that the inner annular heater is disposed inward of an inner surface of the outer annular heater. Both of the inner annular heater and the outer annular heater are disposed radially outward of the shaft 118 of the substrate support 106.

In the embodiment of FIG. 4D, the transparent heater 175 is similar to the embodiment of FIG. 4C, but the annular heater 410 is split into a plurality of sub-heaters 412. The plurality of sub-heaters 412 are arranged to form a ring. The plurality of sub-heaters 412 are similar to the sub-heaters 404 of FIG. 4B. Each of the sub-heaters 412 are connected and able to be adjusted to be at different orientations relative to any one of the other sub-heaters 412. In some embodiments, the plurality of sub-heaters 412 enable the use of less flexible or non-flexible materials within the transparent heater 175 while still conforming the transparent heater 175 to the shape of the object it is coupled to, such as the lower transmissive window 110.

Figure 5:
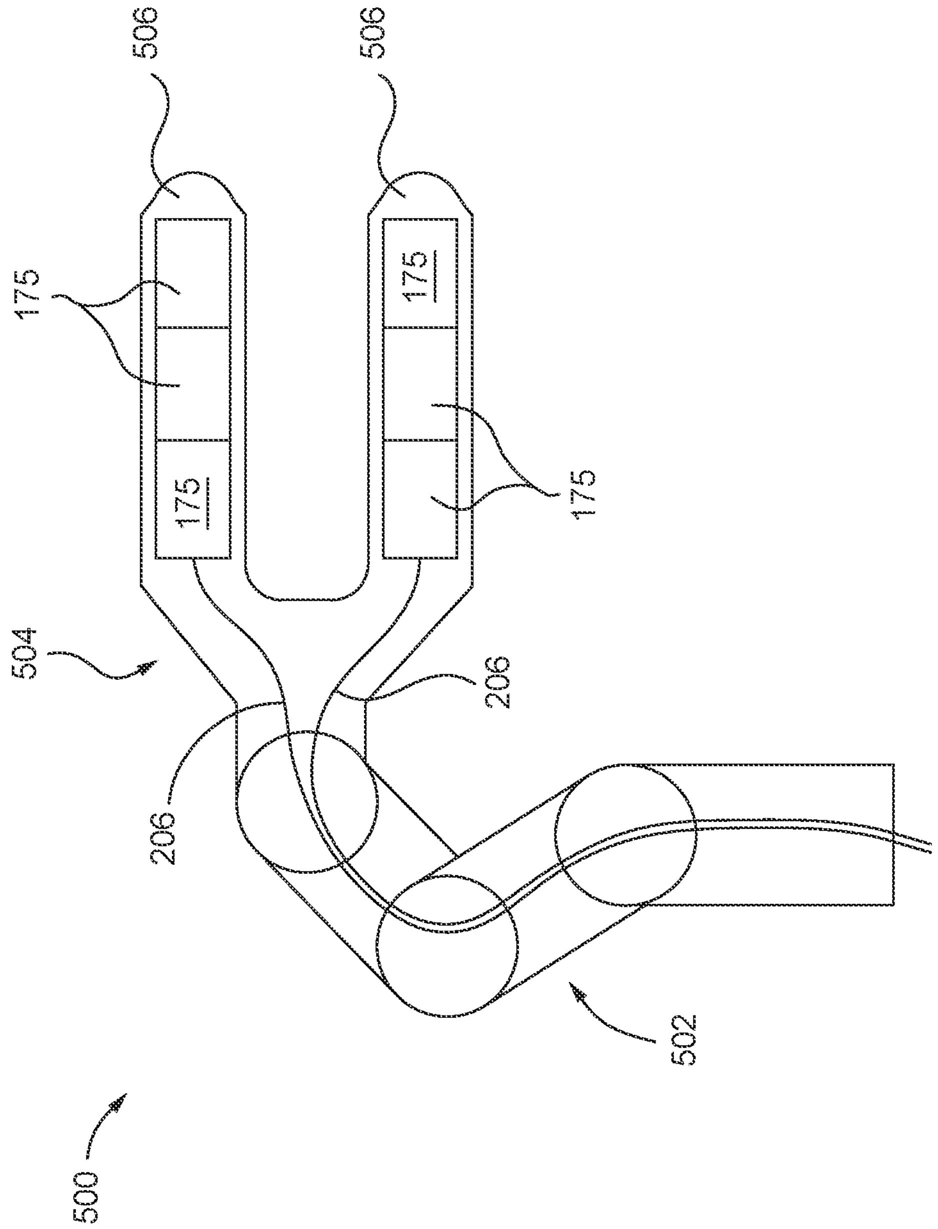
FIG. 5 is a schematic plan view of a substrate transfer robot with transparent heaters disposed thereon, according to embodiments of the disclosure.

FIG. 5 is a schematic plan view of a substrate transfer robot 500 with transparent heaters 175 disposed thereon. The transparent heaters 175 are disposed on one or more blades 506 of the substrate transfer robot 500. The one or more blades 506 are part of the robot head 504. The robot head 504 is coupled to a robot arm 502. The robot arm 502 is configured to actuate the robot head 504 and a substrate supported on the blades 506 of the robot head 504. One or more lead lines 206 are disposed through or on the robot arm 502 and are coupled to the transparent heaters 175. One or more transparent heaters 175 are disposed on each blade 506 of the substrate transfer robot 500, such as a plurality of transparent heaters 175 disposed on each of the blades 506.

The use of the transparent heaters 175 with the substrate transfer robot 500 may reduce the thermal shock when a substrate is placed onto one of the blades 506 of the robot head 504. In some instances, when a hot substrate contacts a cold blade, such as one of the blades 506, the substrate may break or be damaged. The heating of the substrate transfer robot 500 using the transparent heaters 175 enables the reduction of substrate cool-down times within the process chamber, faster substrate-blade relative motion while initiating or ceasing contact with the substrate.

The transparent heaters 175 may be utilized with a wide variety of semiconductor applications and on a variety of semiconductor apparatus. The transparent heaters 175 may be useful when applied to a chamber window, such as the upper transmissive window 108, the lower transmissive window 110, a view port (not shown). Variations of the transparent heaters 175 are also able to be applied to a substrate transfer arm or a cassette. It is also contemplated the transparent heaters 175 may be utilized with other optically transparent components within a semiconductor device chamber.

The use of the transparent heater, such as one of the transparent heaters 175, 176, 177, 178 enables more precise and accurate adjustment of component temperatures within a semiconductor processing chamber, such as a deposition chamber, such as an epitaxial deposition chamber. The flexibility of the transparent heaters as described herein provide the ability to mold the transparent heaters to a non-planar surface. Alternatively, a plurality of non-flexible transparent heaters are utilized and individually applied to a non-planar surface.

The transparent heaters may correct for local variations in temperature on a transparent surface within a semiconductor processing chamber. The local variation in temperature has been shown to enable the formation of films on a surface of the component which faces the substrate process volume. The film is formed by cold spots where additional deposition occurs and etch rates are lower.

The transparent heaters described herein enable more controlled heating, while not obstructing the field of view of pyrometers or radiation from lamps disposed within the process chamber.

While the foregoing is directed to embodiments of the present disclosure, other and further embodiments of the disclosure may be devised without departing from the basic scope thereof, and the scope thereof is determined by the claims that follow.

What is claimed is:

1. A heater assembly, configured for use during semiconductor manufacturing, comprising:

a chamber component;

a transparent heater coupled to an outer surface of the chamber component, the transparent heater is flexible and comprises:

a support base;

an electrode disposed on the support base; and a capping layer disposed on a side of the electrode opposite the support base, the capping layer bonded to the chamber component; and one or more radiation sources operable to transmit heat through the chamber component, wherein a flexible transparent material of the transparent heater has an optical transparency of greater than 80% at a wavelength of radiation emitted by the one or more radiation sources.

2. The heater assembly of claim 1, wherein the transparent heater has an optical transparency of greater than about 80% at a wavelength of less than about 5000 nm.

3. The heater assembly of claim 1, wherein the chamber component is optically transparent and comprises one of a lower transmissive window, an upper transmissive window, or a robot arm.

4. The heater assembly of claim 3, wherein the chamber component is the lower transmissive window and further comprises:

a hollow transmissive member shaft;

a dome portion; and a neck connecting the hollow transmissive member shaft and the dome portion.

5. The heater assembly of claim 3, wherein the chamber component is the upper transmissive window and further comprises:

a dome portion; and a support ring disposed around the dome portion.

6. The heater assembly of claim 1, wherein the chamber component is the robot arm and the transparent heater is disposed on one or more blades of the robot arm.

7. A heater assembly, configured for use during semiconductor manufacturing, comprising:

a transmissive window;

a transparent heater coupled to an outer surface of the transmissive window, the transparent heater is flexible and comprises:

a support base; and an electrode disposed on the support base, the electrode is a heating element; and one or more radiation sources operable to heat through the transmissive window, wherein a flexible transparent material of the transparent heater has an optical transparency of greater than 80% at a wavelength of radiation emitted by the one or more radiation sources.

8. The heater assembly of claim 7, wherein the electrode has a resistivity within a range of about 100 $W/m^2$ to about 5000 $W/m^2$.

9. The heater assembly of claim 7, wherein the support base is a mica material.

10. The heater assembly of claim 9, wherein the mica material is one or a combination of muscovite mica or fluorphlagopite mica.

11. The heater assembly of claim 7, wherein the electrode is a metal nanowire network.

12. The heater assembly of claim 11, wherein a capping layer is disposed over the electrode.

13. The heater assembly of claim 12, wherein the capping layer is bonded to the transmissive window.

14. The heater assembly of claim 12, wherein the capping layer is coupled to the transmissive window using an adhesive.

15. A process chamber, configured for use during semiconductor processing, comprising:

a chamber body;

an upper transmissive window disposed within the chamber body;

a lower transmissive window disposed within the chamber body;

a substrate support disposed between the upper transmissive window and the lower transmissive window;

one or more radiation sources operable to heat the substrate support; and a transparent heater coupled to one of the upper transmissive window or the lower transmissive window at a position between at least one of the plurality of lamps and the one of the upper transmissive window or the lower transmissive window, the transparent heater comprising:

a support base having a transparent material, an electrode layer disposed on the support base and coupled to one or more lead lines, and a capping layer disposed over the electrode layer, the capping layer disposed between the electrode layer and the one of the upper transmissive window or the lower transmissive window.

16. The process chamber of claim 15, wherein a controller is coupled to the transparent heater and the electrode layer is a heating element.

17. The process chamber of claim 15, wherein:

the support base is thicker than the electrode layer and the capping layer;

the transparent material is flexible and has an optical transparency of greater than 80% at a wavelength of radiation emitted by the one or more radiation sources; and the electrode layer, and the capping layer respectively have a Young's modulus less than 150 GPa.

* * * * *